Dec. 30, 1969 I. A. LESK 3,486,950

LOCALIZED CONTROL OF CARRIER LIFETIMES IN P-N JUNCTION DEVICES AND INTEGRATED CIRCUITS

Filed April 26, 1967

INVENTOR.
*Israel Arnold Lesk*

BY

Mueller, Aichele & Rauner

ATTY'S.

United States Patent Office 3,486,950
Patented Dec. 30, 1969

3,486,950

LOCALIZED CONTROL OF CARRIER LIFETIMES IN P-N JUNCTION DEVICES AND INTEGRATED CIRCUITS

Israel A. Lesk, Scottsdale, Ariz., assignor to Motorola, Inc., Franklin Park, Ill., a corporation of Illinois Filed Apr. 26, 1967, Ser. No. 633,834
Int. Cl. H01l 7/44
U.S. Cl. 148—186 15 Claims

ABSTRACT OF THE DISCLOSURE

A process for locally controlling carrier lifetimes in semiconductor devices and integrated circuits by selectively gettering a metal impurity which is diffused into a semiconductor body in which the devices or circuits are constructed. A metal impurity gettering region is formed at the surface of the semiconductor body to getter the metal impurity in selected regions of the semiconductor bodv.

Specification

This invention relates generally to diffusion processes used in the fabrication of semiconductor devices and integrated circuits and more particularly to a diffusion process for locally controlling the carrier lifetimes in PN junction devices.

Background of the invention

It is well known to selectively diffuse a metal impurity such as gold into semiconductor structures and particularly silicon to increase the carrier recombination rates in different regions within these structures. In a given integrated circuit application it may be desirable, for example, to use a high speed switching device, such as a transistor having a relatively low carrier lifetime in combination with a storage diode having a relatively high carrier lifetime. In the past, in order to accomplish selectivity in metal impurity doping, i.e., localized control of metal impurity diffusion, one practice has been to use known masking techniques to prevent the metal impurity from diffusing into certain regions of a semiconductor structure while allowing the metal impurity to diffuse into other regions thereof.

The disadvantages of the above selective diffusion processes in which masking techniques are used lie not only in the extra masking steps which must be employed to selectively control the metal diffusion but also in the fact that masking over a semiconductor surface does not entirely prevent the metal impurity from diffusing into regions beneath the mask. In addition, when known photolithographic masking and etching steps are used to control the metal diffusion, it often becomes necessary to etch openings in a protective coating of the semiconductor, such as silicon oxide, solely for the purpose of diffusing the metal impurity into the semiconductor structure.

Summary of the invention

An object of this invention is to provide a new and improved method for selectively controlling the carrier lifetimes in semiconductor devices and integrated circuits.

Another object of this invention is to provide a diffusion process which does not require separate masking and etching steps in order to locally control the lifetimes of carriers in semiconductor PN junctions.

Briefly, the present invention features a process of carrier lifetime control wherein a metal impurity gettering region is selectively formed at the surface of a semiconductory body for depleting selected regions of the body of a substantial portion of a metal impurity. The metal impurity may be introduced into the body before or after the formation of the gettering region. The metal impurity gettering region lowers the metal impurity concentration in the selected regions of the semiconductor body wherein relatively high carrier lifetimes are desired.

Still other regions within the body contain, for example, transistors which preferably have high switching speeds and low carrier lifetimes. When a metal impurity such as gold is diffused into the body, the metal absorbing effect by the gettering region will deplete the selected regions of the metal impurity and prevent the diffused metal impurity from materially affecting the carrier lifetimes within these selected regions. However, the metal impurity will diffuse uniformly into other regions of the structure to lower the carrier lifetimes therein. This effect on carrier lifetimes in the other regions reduces the charge storage effects within and increases switching speeds of the PN junctions in these other regions.

Description of the preferred embodiments

Figure 1:
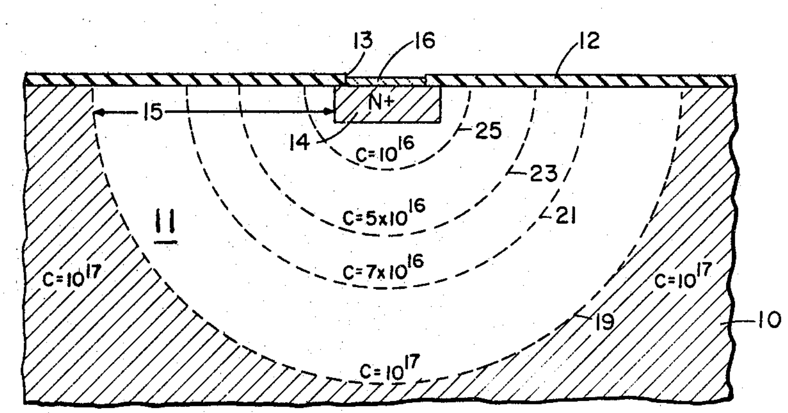
FIG. 1 illustrates a typical impurity concentration (C) profile within an N type semiconductor body which has been selectively doped with phosphorus, and diffused with the metal impurity gold.

Referring to the accompanying drawing, there is shown in FIG. 1 in cross-section an N type semiconductor body 10 such as a wafer of silicon having a protective glass coating 12 of silicon oxide thereon. An opening 13 has been etched in the oxide coating 12, and a highly doped N+ region 14 has been formed by diffusion through the opening 13 and in the body 10 adjacent the upper surface thereof. The N+ region 14 and the silicon-glass interface combine to produce a gettering effect on the metal impurity gold, and the N+ region and its glass interface will be referred to herein as a "metal impurity gettering region." It has been observed that the N+ region alone will getter the gold after the glass layer 16 is removed. However, a considerable amount of gold has been detected at the N+ region 14-glass region 16 interface so that both of the latter two regions are included in the "metal impurity gettering region."

The semiconductor body 10 may be, for example, 6 to 8 mils in total thickness whereas the N+ region 14 extends only a few microns into the body 10. If phosphorus is used as the N+ diffusant to form region 14, a phosphosilicate glass coating 16 will form on the surface of the body 10 as shown in FIG. 1. The phosphorus diffusion can be performed by exposing the opening 13 to vapors of $P_2O_5$ at elevated temperatures as is well known in the art.

Either prior or subsequent to the N+ diffusion to form region 14, the metal impurity gold is diffused into the body 10 through any surface thereof in order to reduce the lifetime of carriers in certain regions of the semiconductor body 10. The interstitial atoms of gold diffuse into the silicon body 10 at an extremely rapid rate when compared to other impurities, e.g., Group III and Group V Periodic Table impurities which are commonly used in diffusion processes.

Once the gold diffusion step has been carried out, the silicon body 10 must be rapidly cooled or quenched by a quick withdrawal from a diffusion furnace in order to prevent out-diffusion or precipitation of the gold. In practice, a thin gold film which is generally 500 angstroms or less in thickness is first deposited upon the lower surface of the silicon body 10. Then the body 10 is placed in a diffusion furnace, brought up to a diffusion temperature which typically ranges from approximately 950° C. to approximately 1000° C. and left at the diffusion temperature for approximately 15 minutes. A higher diffusion temperature such as 1050° C. requires a diffusion time of only 5 minutes whereas even higher diffusion temperatures in the order of 1150° C. require corresponding diffusion times in the order of 2½ to 3 minutes. However, it will be understood by those skilled in the art that these diffusion times and temperatures may be varied over a wide range without departing from the scope of this invention. If the gold diffusion step is carried out in such a manner that out-diffusion or precipitation of the gold does not occur, then any variance in the above typical ranges of time and temperature would not amount to a departure from the scope of this invention. For a further and more complete discussion of gold diffusion techniques, reference should be made to Warner et al., Integrated Circuits—Design Principles and Fabrication, Motorola Series in Solid State Electronics, McGraw-Hill, 1965.

After the metal impurity gold is diffused into the semiconductor body 10, the gold atoms in a semi-spherical region 11 defined by arc length 15 are gettered by the metal impurity gettering region (region 14 and its glass interface) as illustrated by the equi-concentration impurity contours shown in FIG. 1. Outside the outermost contour 19 the gettering has no effect on the gold concentration in the silicon and the gold concentration outside contour 19 is typically in the order of $10^{17}$ atoms per cubic centimeter. For the contours 21, 23 and 25 which are closer to the metal impurities gettering region, the gold concentration C in atoms per cubic centimeter becomes increasingly less as indicated numerically in FIG. 1. Thus, it is seen that selected regions within the silicon body 10 can be depleted of a substantial amount of the gold concentration that would otherwise be present in the absence of the metal impurity gettering region. Accordingly, if it is desired to reduce the metal impurity concentration below a preselected value in a certain region of the semiconductor body 10 in order to increase carrier lifetimes therein, e.g., reduce the gold concentration in the semi-spherical region 11 defined by arc distance 15, then the process according to this invention may be used. The heavily doped N+ region 14 and the phosphosilicate glass layer 16 are formed using known phosphorus diffusion techniques, and these regions produce a gold gettering effect which substantially reduces the gold concentration as shown in the semispherical region 11 in which no cross-hatching appears. For example, it may be desired to construct a storage diode within one or more of the equi-concentration contours in FIG. 1 where the storage diode requires a gold concentration which is preferably less than $10^{17}$ atoms per cubic centimeter. The particular location of the diode between contour 19 and the N+ region 14 may be selected by one skilled in the art, knowing a required gold concentration for a given PN diode junction.

Figure 2:
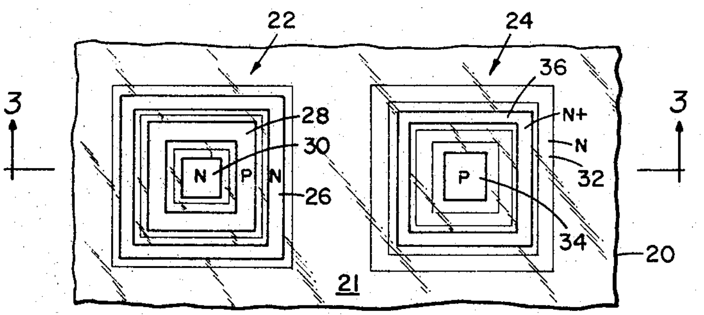
FIG. 2 is a plan view of a semiconductor body in which a high speed NPN transistor and a PN storage diode have been constructed in accordance with the present invention.
Figure 3:
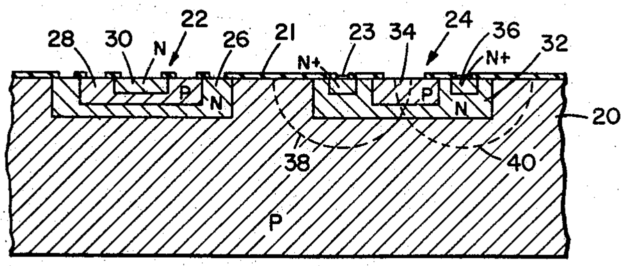
FIG. 3 is a cross-section view of FIG. 2 taken along lines 3—3 of FIG. 2.

FIGS. 2 and 3 illustrate a practical application of the process according to this invention wherein the process is used to form an intermediate semiconductor structure used in a monolithic integrated circuit. Such integrated circuit may require, for example, a high speed switching transistor 22 which will be connected to a storage diode 24 within the upper regions of silicon substrate 20. The switching transistor 22 and storage diode 24 may be constructed using well known steps in the art of integrated circuit construction, e.g., masking, etching, diffusion, etc. The transistor 22 includes collector, base and emitter regions 26, 28 and 30, and the storage diode 24 includes a P type anode region 34 and an N type cathode region 32.

Suppose that it is now desired to diffuse a metal impurity such as gold into the substrate 20 to lower the carrier lifetimes in and increase the switching speed of the NPN transistor 22 and simultaneously maintain the gold concentration in the P and N type regions 34 and 32 below a preselected level. This result can be achieved by diffusing an N+ ring or band 36 into the N type region 32 in order to produce the same gettering effects described above with reference to FIG. 1. The equi-concentration contours 38 and 40 represent, for purposes of illustration, any one of the contours 19, 21, 23 or 25 in FIG. 1. The particular contour selected depends upon the allowable gold content in the P and N type regions of the storage diode 24 and the diffusion depths of these regions. The N+ ring or band 36 makes excellent ohmic contact with metalization (not shown) which may be subsequently deposited on the surface of the P and N type regions in FIG. 3 to provide electrical contact thereto. Such layer of metallization also provides electrical contact to the transistor 22 and to other devices (not shown) that may be constructed in the upper surface regions of the substrate 20. The substrate 20 is typically in the order of 6 to 8 mils in thickness and the devices 22 to 24 are usually constructed within a depth not exceeding 1 mil, only ⅛ of the total substrate thickness.

The glass layer 23 in FIG. 3 corresponds to the layer of phosphosilicate glass 16 in FIG. 1, but it will be appreciated by those skilled in the art that the N+ region 36 in FIG. 3 is not limited to one produced by phosphorus and the glass layer 23 is not limited to phosphosilicate glass. Where a phosphorous compound is used to form the N+ diffusion 36, the glass layer 23 which is formed on the surface of region 36 is a phosphosilicate glass as described above with reference to FIG. 1. However, arsenic and antimony compounds may be used in known diffusion processes to form the N+ region 36 in FIG. 3, and these latter compounds will produce respectively an arsenic silicate glass and an antimony silicate glass layer 23 on the surface of the substrate 20 in FIG. 3.

It is well known in the art that phosphorus, arsenic and antimony are common donor impurity elements and may be diffused into a semiconductor such as silicon to form a heavily doped N+ region. The details, i.e., diffusion times, temperatures etc., of forming the heavily doped N+ region 36 in which phosphorus, arsenic or antimony is diffused are well known to those skilled in the art of solid state diffusion and will not be given here.

An N+ region formed by diffusing either phosphorus, arsenic or antimony and the associated surface glass formed on these regions all constitute a metal impurity gettering region within the scope of this invention. The N+ region 36 formed by diffusing phosphorus, arsenic or antimony into the substrate 20 will getter the metal impurities such as gold, copper, iron and nickel.

When gold, iron, nickel or copper are diffused into the substrate 20 as described above with reference to FIG. 1, these metal impurities will be gettered by the N+ regions 36 and the N+ region 36-glass interface 23 whether the N+ region has been formed by phosphorus, arsenic or antimony diffusion.

If a P+ region (not shown) instead of N+ region 14 is diffused into a semiconductor substrate, such diffusion will also have a gettering effect on the metal impurity diffused into the substrate. For example, if the semiconductor body 10 in FIG. 1 is exposed to $B_2O_3$ vapors at elevated temperatures, a P+ region may be formed in place of the N+ region 14 as shown and a borosilicate glass coating will be formed upon the P+ region during the diffusion process. However, when a P+ boron diffusion is made, a metal impurity such as gold has been found to concentrate more in the borosilicate glass coating than in the P+ region.

Other Group III Periodic Table elements such as aluminum and gallium may be used to form P+ diffusions for producing metal impurity gettering effects within the scope of this invention. For a further detailed description and theoretical analysis of the diffusion of impurities into semiconductor bodies see Trumbore, "Solid Solubilities of Impurity Elements in Germanium and Silicon," Bell System Technical Journal, 1960, pages 205–233, and Schockly et al. "Metal Precipitates in Silicon PN Junctions," Journal of Applied Physics, Volume 31, No. 10, October 1960—pages 1821–1824.

Accordingly, the invention described is limited only by way of the following appended claims.

I claim:

1. A method for locally controlling carrier lifetimes in a semiconductor body having at least one pn junction region therein, said method including the steps of (a) forming a metal impurity gettering region within said body, said junction region requiring a relatively high carrier lifetime.

(b) diffusing a metal impurity into said body for decreasing carrier lifetimes in yet other regions of said body, and (c) gettering said metal impurity from said junction region into said impurity gettering region, thereby reducing the metal impurity content and increasing the carrier lifetime in said junction region.

2. A method for locally controlling carrier lifetimes in a semiconductor body within which certain semiconductor devices are constructed adjacent one major face of the body, one of the semiconductor devices containing a pn junction constructed in a selected surface region of the body requiring a relatively high carrier lifetime, said method comprising (a) forming a metal impurity gettering region within one portion of said semiconductor body and adjacent to said selected region of said body requiring a relatively high carrier lifetime, and (b) diffusing a metal impurity into said body for lowering the carrier lifetimes in regions of said body other than said selected region whereby the metal impurity within said selected region is gettered therefrom into said metal impurity gettering region, thereby maintaining the carrier lifetimes in said selected region above a predetermined level.

3. The method according to claim 2 wherein said metal impurity gettering region is formed by diffusing into said portion of said body a donor impurity selected from the group consisting of phosphorus, arsenic and antimony.

4. The method according to claim 2 wherein said metal impurity gettering region is formed by diffusing into said portion of said body an acceptor impurity selected from the group consisting of boron, gallium and aluminum.

5. The method according to claim 2 wherein said metal impurity is selected from the group consisting of gold, copper, iron and nickel.

6. The method according to claim 2 wherein said metal impurity is gold which is diffused into said semiconductor body at temperatures ranging from 950° C. and 1150° C. for diffusion times ranging from between 15 minutes to 2½ minutes respectively.

7. The method according to claim 2 wherein said metal impurity is gold which is diffused into said semiconductor body at a temperature of approximately 1050° C. for approximately five minutes.

8. The method according to claim 2 wherein said metal impurity is gold which is diffused into said semiconductor body at a temperature of approximately 950° C. for approximately 15 minutes.

9. The method according to claim 6 wherein said metal impurity gettering region is formed by diffusing in said portion of said body a donor impurity selected from the group consisting of phosphorus, arsenic and antimony.

10. The method according to claim 9 wherein said metal impurity is selected from the group consisting of gold, copper, iron and nickel.

11. The method according to claim 6 wherein said metal impurity gettering region is formed by diffusing in said portion of said body an acceptor impurity selected from the group consisting of boron, gallium and aluminum.

12. The method according to claim 11 wherein said metal impurity is selected from the group consisting of gold, copper, iron and nickel.

13. A method for locally controlling carrier lifetimes in a semiconductor body having one major surface adjacent to which various semiconductor devices may be constructed, said body having at least one pn junction region therein adjacent to said one major surface requiring a relatively high carrier lifetime and having at least one other region therein requiring a relatively low carrier lifetime, said method comprising the steps of (a) selectively forming a gold gettering region within said body and adjacent to said pn junction region therein, (b) depositing a thin layer of gold onto said body, (c) heating said body and said layer of gold to an elevated temperature sufficient to allow said gold to diffuse into said body and be partially absorbed by said gold gettering region, and (d) rapidly cooling said body in order to prevent precipitation of the gold therefrom whereby the carrier lifetimes in said pn junction region are substantially longer than the carrier lifetimes in said other region of said body.

14. The method according to claim 13 wherein said gold gettering region is formed by selectively diffusing into said body a donor impurity selected from the group consisting of phosphorus, arsenic and antimony.

15. The method according to claim 14 wherein said body is heated to a temperature from between approximately 950° C. and 1150° C. for times ranging from between 15 and 2½ minutes respectively.

References Cited

UNITED STATES PATENTS

| | | | |
|---|---|---|---|
| 3,440,113 | 4/1969 | Wooley | 148—189 |
| 3,440,114 | 4/1969 | Harper | 148—188 |

L. DEWAYNE RUTLEDGE, Primary Examiner

R. A. LESTER, Assistant Examiner

U.S. Cl. X.R.

148—187, 188, 190